United States Patent
Ummelmann et al.

(10) Patent No.: US 9,231,520 B2
(45) Date of Patent: Jan. 5, 2016

(54) WIEN-BRIDGE OSCILLATOR AND CIRCUIT ARRANGEMENT FOR REGULATING A DETUNING

(71) Applicant: Infineon Technologies AG, Neubiberg (DE)

(72) Inventors: Detlef Ummelmann, Munich (DE); Ansgar Pottbaecker, Grafing (DE)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 13/848,705

(22) Filed: Mar. 21, 2013

(65) Prior Publication Data

US 2014/0285274 A1    Sep. 25, 2014

(51) Int. Cl.
*H03B 5/26* (2006.01)
*H03B 5/20* (2006.01)

(52) U.S. Cl.
CPC ... *H03B 5/20* (2013.01); *H03B 5/26* (2013.01)

(58) Field of Classification Search
CPC .................................... H03B 5/26; H03B 5/20
USPC ........................ 331/111, 137, 140, 141, 143
See application file for complete search history.

(56) References Cited

U.S. PATENT DOCUMENTS 4,339,829 A * 7/1982 Dimon ........................... 455/340
2004/0041599 A1 * 3/2004 Murphy ........................ 327/129

OTHER PUBLICATIONS

De Smedt, V. et al., "A 66 µW 86 ppm/°C Fully-Integrated 6 MHz Wienbridge Oscillator With a 172 dB Phase Noise FOM," IEEE Journal of Solid-State Circuits, vol. 44, No. 7, Jul. 2009, pp. 1990-2001.

* cited by examiner

*Primary Examiner* — Richard Tan
(74) *Attorney, Agent, or Firm* — Slater & Matsil, L.L.P.

(57) ABSTRACT

An oscillator circuit includes a Wien-bridge oscillator. A non-detuned oscillating signal and a detuned oscillating signal are tapped from the Wien-bridge oscillator. A sum of a weighted detuned signal and a weighted non-detuned signal is coupled as feedback signal to the Wien-bridge to control the oscillation amplitude.

19 Claims, 7 Drawing Sheets

PRIOR ART

WIEN-BRIDGE OSCILLATOR AND CIRCUIT ARRANGEMENT FOR REGULATING A DETUNING

TECHNICAL FIELD

The present invention relates generally to a Wien-bridge oscillator and a circuit arrangement.

BACKGROUND

In many electric circuits including so-called integrated circuits, i.e., ICs, a fully integrated oscillator is needed for generating a reference clock signal with high frequency accuracy and with very low temperature and long-term drift. Clock signal generators are known to be used for a variety of applications, for example, for digital signal processing circuits. Highly accurate clock signal generators are typically used in analog-to-digital devices, i.e., for sampling an analog signal to produce a corresponding digital signal.

In conventional applications and for this purpose relaxation oscillators have been used, which exhibit low complexity and can be easily adjusted or programmed. However, a drift in frequency typically does not only originate from parameter changes of the primary passive frequency determining components like resistors and capacitors. Also active circuit components such as transistors in current mirrors, switches and comparators may cause a drift in frequency effectuated by temperature influence or stress on the components.

To a large extent this additional drift in frequency effectuated by parameter changes of active circuit components can be avoided through use of a harmonic oscillator comprising a resonator having a high quality factor wherein it is assumed that the active circuit portion fulfills some minimum requirements. In the case of a Wien-bridge oscillator and when operated at oscillation frequency the amplifier stage must comply with a minimum amplification and a maximum phase shift, in order to stay below a predefined maximum frequency drift of, for example, ±1%. As long as the minimum requirements are fulfilled the high quality factor of the resonator provides for corresponding high frequency stability. The quality of an open oscillatory circuit system is a measure of the capability of the closed oscillatory to suppress variations in the oscillation frequency. Then the drift in frequency is substantially independent of parameter changes of the active components and is caused primarily by temperature variations of the passive circuit devices.

In the following and with reference to FIG. 1 the basic properties of a Wien-bridge oscillator 110 are described wherein a conventional Wien-bridge 110 shown in the dotted circle.

The resonant frequency $\omega_r$ of the Wien-bridge is determined by resistors R1, R2 and capacitors C1, C2 as $$\omega_r = \frac{1}{\sqrt{R1 \cdot R2 \cdot C1 \cdot C2}}$$

wherein in many applications the values of the components is chosen as R1=R2=R and C1=C2=C. Consequently the resonant frequency is determined by $$\omega_r = \frac{1}{RC}$$

The complex transfer function normalized to the resonant frequency is $$F(s = j\Omega) = -\frac{1}{3+\varepsilon} \cdot \frac{1 - \Omega^2 - j\varepsilon\Omega}{1 - \Omega^2 + 3j\Omega} \quad (1)$$

wherein $$\Omega = \frac{\omega}{\omega_r},$$

and wherein variable $\varepsilon$ is a positive number, $\varepsilon < 1$, and that describes the detune of the bridge circuit.

From equation (1) the frequency response $\Phi$ of the phase shifting follows as $$\Phi = \arctan\left[-(3+\varepsilon)\frac{\Omega(1-\Omega^2)}{(1-\Omega^2)^2 - 3\varepsilon\Omega^2}\right]$$

Figure 2A:
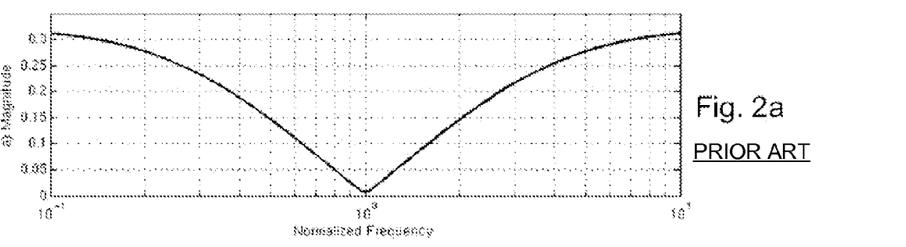
FIGS. 2a, 2b, and 2c depict a frequency response of amplitude (magnitude), of phase shifting (phase) and the relation of phase shifting and detune of a Wien-bridge oscillator.
Figure 2B:
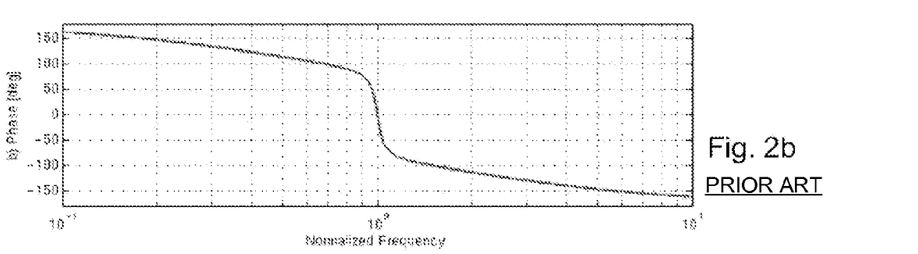
Figure 2C:
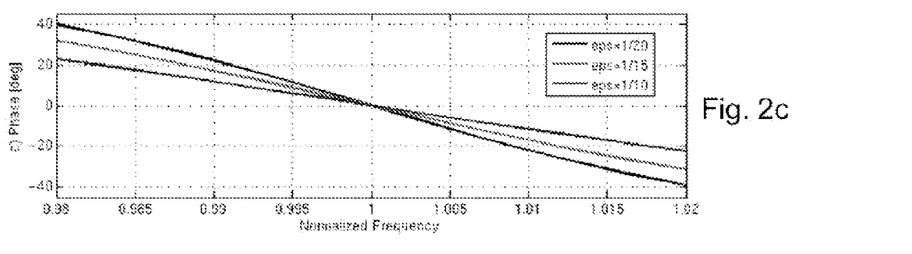

FIGS. 2a and 2b depict the frequency response of the amplitude (magnitude) and of the phase shifting (phase) for $\varepsilon = 1/15$. FIG. 2c illustrates the relation between phase shifting and detune $\varepsilon$ (eps) in a frequency range of about ±2% around the resonant frequency.

As shown in FIG. 2b the frequency response of the phase shifting exhibits a steep slope around normalized resonant frequency. Based on this property, high-quality oscillators, i.e., oscillators exhibiting high stability in frequency, can be implemented based on Wien-bridge resonators. However, a downside of a Wien-bridge oscillator is the attenuation of the signal amplitude at resonant frequency. For calculating the gain of the circuit, we assume that oscillation frequency matches resonant frequency, which is approximately true for a phase shift of less than 10 degrees, confer FIG. 2b, and if the detune $\varepsilon$ is small.

In a non-detuned Wien-bridge circuit, i.e., $\varepsilon = 0$, the differential output signal would be zero. As a consequence the Wien-bridge necessarily must be detuned slightly in order to comply with the requirement of oscillating with constant amplitude.

The quality factor of a resonant circuit is $$Q = \frac{1}{2}\frac{d\Phi}{d\Omega}(\Omega = 1) = \frac{1}{\varepsilon} + \frac{1}{3} \approx \frac{1}{\varepsilon}$$

Note that generally the quality of a resonant circuit is defined as partial derivative of amplitude and phase at oscillation frequency. Since in the case considered here the partial derivative of the amplitude is zero at resonant frequency, the partial derivative of the phase remains.

Accordingly the correlation between detune and quality, i.e., stability in frequency, of a resonant circuit can be characterized in that the lower the detune, the higher is the quality, i.e., stability in frequency, of the resonant circuit.

Figure 1:
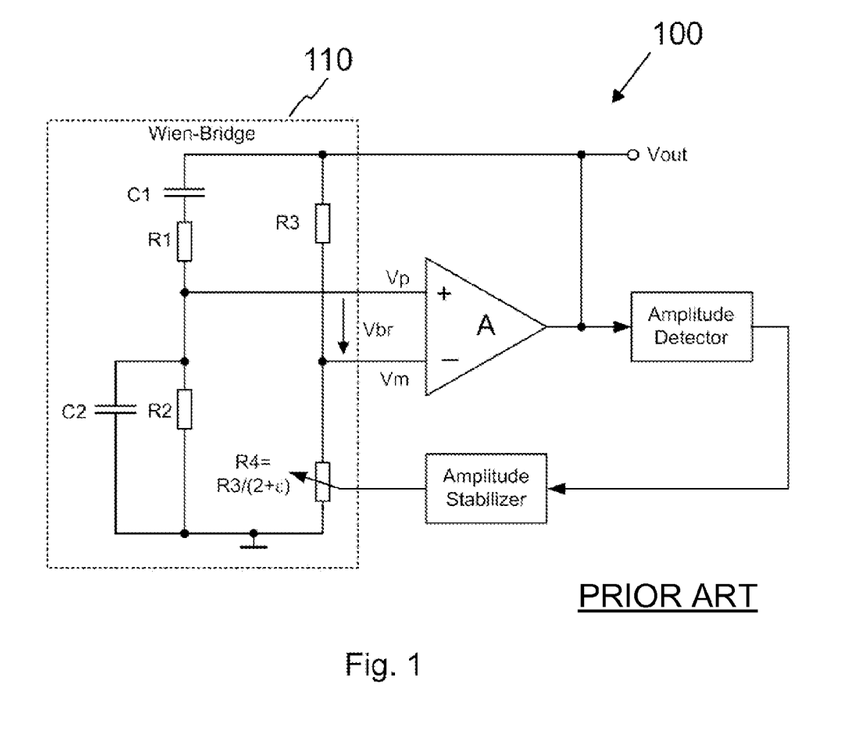
FIG. 1 depicts a block schematic of a Wien-bridge oscillator.
Figure 3:
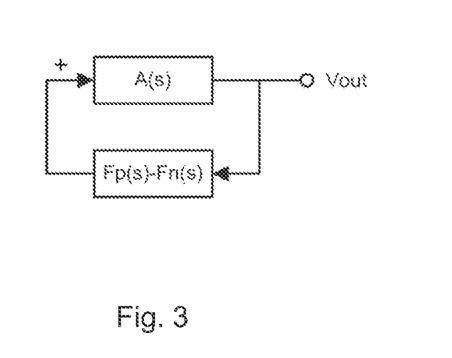
FIG. 3 depicts a schematic of a feedback loop.

The oscillator circuit comprising the Wien-bridge and the amplifier as depicted in FIG. 1 can be simplified to a schematic circuit depicted in FIG. 3. The schematic illustrates a transfer function of the feedback loop and can be analyzed based on the frequency response of the feedback loop amplification T(s):

$$T(s)=A(s)\cdot[F_p(s)-F_n(s)]=A(s)\cdot F(s)$$

wherein A(s) is the gain of the amplifying element in the circuit and $$F_p(s)-F_n(s)=F(s)=\frac{V_{br}}{V_{out}}$$

describes the transfer function of the feedback path.

The Barkhausen criterion is a (mathematical) condition to determine when a linear electronic circuit will oscillate and provides the necessary—but not sufficient—conditions for a stable oscillation. More precisely the Barkhausen criterion consists of two conditions, namely:

1. The absolute value of the loop gain in an amplifier with feedback path as depicted in FIG. 3 must be equal to unity in absolute magnitude, i.e., $$|T(s=j\omega_0)|=1|$$

2. The phase shift at the oscillating frequency must have a positive feedback. This condition is satisfied when the phase shift is an integer multiple of 360°:

$$\angle T(s=j\omega_0)=z\cdot 360° \text{ wherein } z=0, 1, 2, \ldots$$

In this embodiment a phase shift of z=0, i.e., 0° phase shift is considered.

It follows from the amplitude condition, i.e., the first of the above mentioned conditions, that the necessary gain A is higher when the detune is lower.

It can be shown that in a stable oscillating state it follows from the Barkhausen criteria that an amplification of $A=(9/\epsilon)+3$ is required at the resonant frequency.

As a consequence in Wien-bridges the requirements for the amplifier stage are high, i.e., the amplifier stage must exhibit a high gain while at the same time exhibiting a low phase shift. In one embodiment the absolute value of the phase shift should be below 10° since in this range only a high quality and frequency stability can be achieved, i.e., the frequency response of the phase shift of the Wien-bridge is steep. Consequently the amplifier stage is a crucial component of the oscillator. Drift caused by temperature variation and process parameter variation may have significant influence on the accuracy of the oscillation frequency, as these typically cause significant variations in gain and phase shift in amplifier circuits.

With respect to the quality factor, i.e., stability in frequency, optimum solutions can be achieved by adjusting the detune $\epsilon$ of the Wien-bridge to a value high enough so that the oscillation amplitude exhibits a sufficient high value.

The achieved solution furthermore shall effectuate that the drift in frequency caused by temperature variations as far as possible depends on the temperature coefficients of the resistors in the Wien-bridge instead of depending on any semiconductor component as known from conventional circuits.

SUMMARY OF THE INVENTION

Embodiments of the invention provide an oscillator circuit comprising a Wien-bridge wherein a first feedback signal portion of zero detune and a second feedback signal portion exhibiting detune are coupled to the Wien-bridge. In one embodiment the first and second portion of the feedback signal are furthermore weighted before being coupled to the Wien-bridge.

BRIEF DESCRIPTION OF THE DRAWINGS

The present invention will be understood more fully from the detailed description given below and from the accompanying drawings of the invention, which, however, should not be taken to limit the invention to the specific embodiments, but are for explanation and understanding only and wherein.

DETAILED DESCRIPTION OF ILLUSTRATIVE EMBODIMENTS

Figure 4:
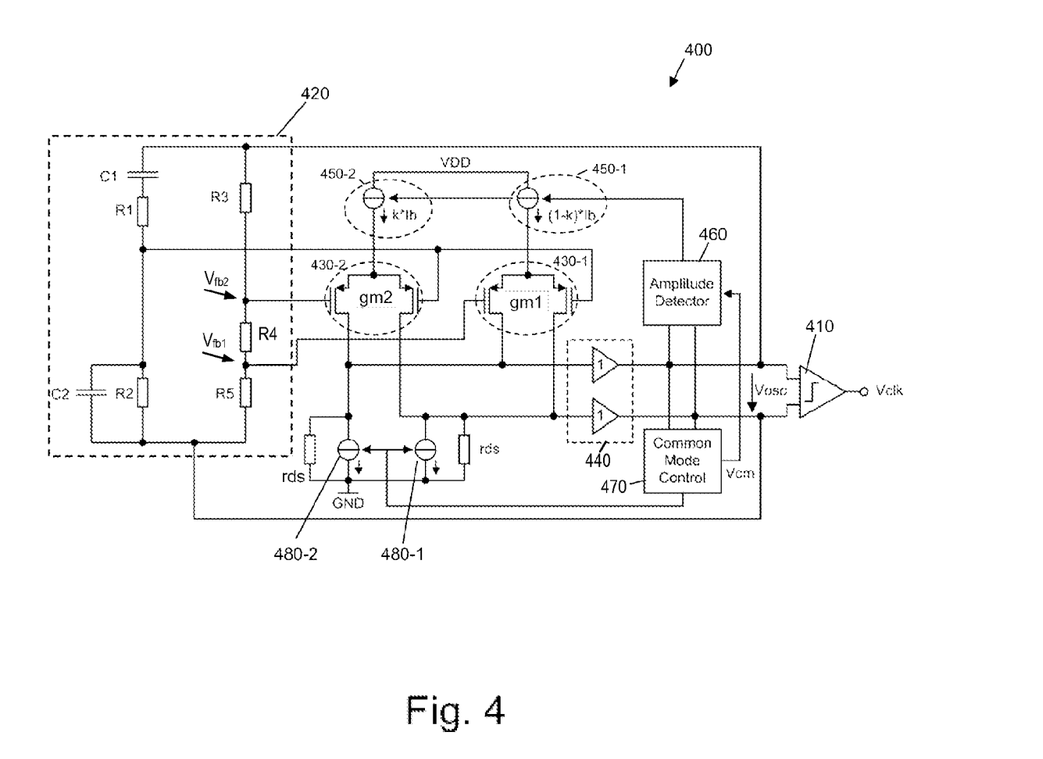
FIG. 4 depicts an oscillator circuit comprising a Wien-bridge.

FIG. 4 depicts a schematic of an oscillator circuit 400 comprising a Wien-bridge that outputs an oscillating voltage Vosc, which is coupled to a comparator 410 that toggles its output depending on Vosc thus outputting a clock signal Vclk.

Reference numeral 420 depicts a Wien-bridge that acts as a resonator. The Wien-bridge comprises in its one path, shown on the left hand side, a series of resistor R1 and capacitor C1 being in series with parallel arrangement of C2 and R2. The other path, shown on the right hand side of the Wien-bridge, comprises a first ohmic resistor R3 in series with ohmic resistors R4, R5.

In a non-limiting embodiment the circuit components may be dimensioned as:
resistors: R1=R2=R=50 kΩ, R3=250 kΩ, R4=5 kΩ, R5=120KΩ
capacitors: C1=C2=C=5 pF
resonant frequency $f_{osc\_ideal}=1/(2\cdot\pi\cdot R\cdot C)\approx 125$ kHz
detune values $\epsilon 1=\frac{1}{8}$, $\epsilon 2=0$
bias current Ib=7.5 μA.

In the depicted circuitry the implementation of amplifying and adding the signals is implemented differentially, since differential circuits basically are less sensitive to variations in supply voltage than single-ended implementations. Further, also effectuated by the fully differential implementation using two transistor pairs, there is almost no additional temperature drift due to the amplitude stabilization. Both aspects are of particular advantage in integrated circuits.

As discussed before the frequency of the oscillation in the Wien-bridge must be prevented from matching exactly the resonant frequency of the circuit, since then the voltage between the taps of the path, which is coupled to the comparator, would drop to zero. As a result, the Barkhausen criterion 1 would not be fulfilled. Consequently, the feedback signal coupled to the Wien-bridge must effectuate a sufficient detune of the oscillating frequency.

This is achieved by coupling a feedback signal to the Wien-bridge comprising a weighted and amplified detuned signal portion and a weighted non-detuned signal portion wherein the weighting of these two portions depends on the amplitude of the oscillation voltage Vosc. The detuned signal portion may be based on voltage Vfb1 exhibiting a non-zero detune of, for example, $\epsilon=\frac{1}{8}$ and which may be tapped from the Wien-bridge between resistors R4 and R5 as illustrated in the figure. The non-detuned signal portion, i.e., the signal portion exhibiting a detune of $\epsilon=0$, may be based on voltage Vfb2.

For amplifying the oscillating voltage Vfb1 the circuit comprises a first amplification means 430-1, which in the depicted embodiment may be implemented by a differential amplifier comprising a pair transistors controlled by voltage Vfb1. Similarly, for amplifying oscillation voltage Vfb2, the circuit comprises second amplification means 430-2 that in the depicted embodiment is implemented by a differential amplifier comprising another pair of transistors. Note that any suitable amplification means for amplifying the voltages can be used here as a replacement of the differential amplifiers comprising the transistors. The disclosed invention shall not be limited in this regard. Furthermore, when implementing the amplifier means by differential amplifiers, the differential amplifiers can be implemented using any suitable circuitry, but shall not be limited to the depicted circuitry based on P-MOS transistors.

First amplification means 430-1 accordingly outputs amplified voltage Vfb1 and second amplification means 430-2 outputs amplified voltage Vfb2. The output signals of the first and second amplification means are added, which in this embodiment is achieved by connecting the drains of the transistors of the differential amplifiers. The resulting signal may then be forwarded a buffer stage 440 that amplifies and couples the resulting signal, i.e., the oscillating voltage Vosc to comparator 410. Buffer stage 440 decouples the high-impedance output of the amplifier from the Wien-bridge and typically exhibits a gain of 1.

First amplification means 430-1 is supplied by a first current source 450-1, which provides a portion (1−k) of a bias current $I_b$, i.e., a portion $(1-k)\cdot I_b$, to the first amplification means 430-1, wherein k with 0≤k≤1 is a weighting factor. Second amplification means 430-2 is supplied by a second current source 450-2 that provides a portion k with 0≤k≤1 of bias current $I_b$, i.e., $k\cdot I_b$, to the second amplification means 430-2. Accordingly with decreasing k the portion of bias current $I_b$ provided by the first current source 450-1 to the first differential amplifier 430-1 increases and the port of the bias current provided by the second current source 450-2 to the second differential amplifier decreases. As a consequence, for k being small, i.e., for 0≤k<½, the detuned signal Vfb1 is amplified more than the non-detuned signal Vfb2. Conversely, i.e., with increasing k, the portion of bias current $I_b$ provided by second current source 450-2 to the second differential amplifier increases and the portion of bias current $I_b$ provided by the first current source 450-1 decreases. Hence, for k being large, i.e., for ½<k<1, the non-detuned signal Vfb2 is amplified more than the detuned signal Vfb1. So by controlling the value of k the mixture of the added signal the amplification effectuated by the first and second differential amplifier can be controlled, consequently the ratio of the amplified detuned signal portion as output by the first differential amplifier 430-1 to the amplified non-detuned signal portion in the resulting signal provided to buffer 440 can be controlled.

The resulting effective detune $\epsilon_{eff}$ can be calculated as $$\epsilon_{eff} = \frac{\epsilon 1 \cdot gm1(3+\epsilon 2) + \epsilon 2 \cdot gm2(3+\epsilon 1)}{gm1(3+\epsilon 2) + gm2(3+\epsilon 1)}$$

In case differential amplifiers are of identical dimensions, i.e., exhibit identical amplification, then the amplification is $gm1=gm_{max}\cdot(1-k)$ and $gm2=gm_{max}\cdot(1-k)$. As mentioned above, weighting factor k may take values in the range 0≤k≤1. In order to increase the detune of Vosc the amplification of the detune signal portion Vfb1 must be increased and the amplification of the non-detuned signal portion Vfb2 must be decreased correspondingly, i.e., k must be decreased. Vice versa, i.e., to decrease the detune of Vosc, the amplification of the detuned signal Vfb1 may be reduced and the amplification of the non-detuned signal Vfb2 may be increase, which can be achieved by increasing the value of weighting factor k. Accordingly, maximum detune can be achieved by setting weighting factor k to zero, and minimum detune can be achieved by setting weighting factor k to 1.

In this way the detune of voltage Vosc can be controlled by setting weighting parameter k. Since the detune correlates with the amplitude of voltage Vosc, the detune serves as means for controlling Vosc so that its amplitude triggers comparator 410.

Weighting factor k is controlled by amplitude detector 460, which takes voltage Vosc as input signal. By comparing the amplitude of Vosc to a predefined threshold value, amplitude detector 460 may set weighting factor k. If amplitude detector 460 detects that the voltage amplitude of Vosc is way above its predetermined threshold value, it may set the weighting factor k to a value of ½<k<1 for decreasing the detune and thus decreasing the amplitude of Vosc in order to prevent an overshooting voltage Vosc. Vice versa, i.e., if amplitude detector 460 detects a situation wherein the amplitude of Vosc is below the predetermined threshold then it may set the weighting factor k to a value of 0<k<½ in order to increase the amplification of detuned signal Vfb1 by increasing the amplitude of bias current $I_b$. As indicated in FIG. 4, weighting factor k is connected as control signal to the second current source 450-2 and (1−k) is coupled to current source 450-1 as control value. In one embodiment weighting factor k and (1−k) respectively may be implemented as control voltages for controlling current sources 450-2 and 450-1 respectively.

In this way, i.e., by monitoring the amplitude of voltage Vosc, the amplitude detector 460 may set weighting factor k correspondingly and thus may control the amplitude of Vosc to a desired range.

At operation startup of the circuit, i.e., if there is no oscillation, the value of weighting factor k is set to a value of k=0 in order achieve maximum detune of the circuit to start the oscillation. Bias current $I_b$ in this situation accordingly entirely flows through differential amplifier 450-1 thus providing a maximum amplification of Vfb1. Then, as soon as oscillation has started and the amplitude of Vosc has reached a predefined level, the amplitude detector 460 may route a portion of bias current $I_b$ to differential amplifier 450-2 by increasing the value of weighting factor k to a value above zero. By increasing the amplification of non-detuned voltage Vfb2, i.e., decreasing to the same extent detuned voltage Vfb1, the detune of Vosc is reduced.

The effective detune that takes weighting factor k into account can be described by $$\epsilon_{eff}(k) = \frac{3\cdot\epsilon 1\cdot(1-k) + 3\cdot\epsilon 2\cdot k + \epsilon 1\cdot\epsilon 2}{3 + \epsilon 1\cdot k + \epsilon 2(1-k)}$$

For ε2=0 follows $$\varepsilon_{\mathit{eff}}(k) = \frac{3 \cdot \varepsilon 1 \cdot (1-k)}{3 + \varepsilon 1 \cdot k}$$

For k=½ the bias current flowing through the first differential amplifier 450-1 is equal to that flowing through second differential amplifier 450-2, so that the resulting effective detune is $$\varepsilon_{\mathit{eff}}\left(k = \frac{1}{2}\right) = \frac{3 \cdot \varepsilon 1}{6 + \varepsilon 1} \approx \frac{1}{2}\varepsilon 1$$

The circuit as depicted in FIG. 4 furthermore comprises common mode control 470 for controlling the common mode operation of first and second differential amplifier 450-1 and 450-2 respectively. The common mode control 470 takes voltage Vosc as input and controls by means of current sources 480-1 and 480-2 the common mode operation of the transistors in the first and second differential amplifier 450-1, 450-2. In addition to controlling current sources 480-1, 480-2, common mode control 470 provides a control signal, i.e., the common mode voltage, to amplitude detector means 460 as indicated by the arrow connection.

Note that resistors 480-1 and 480-2 respectively reflect the drain-source resistance of the transistors used in the current source 480-1 and 480-2 respectively.

Figure 5:
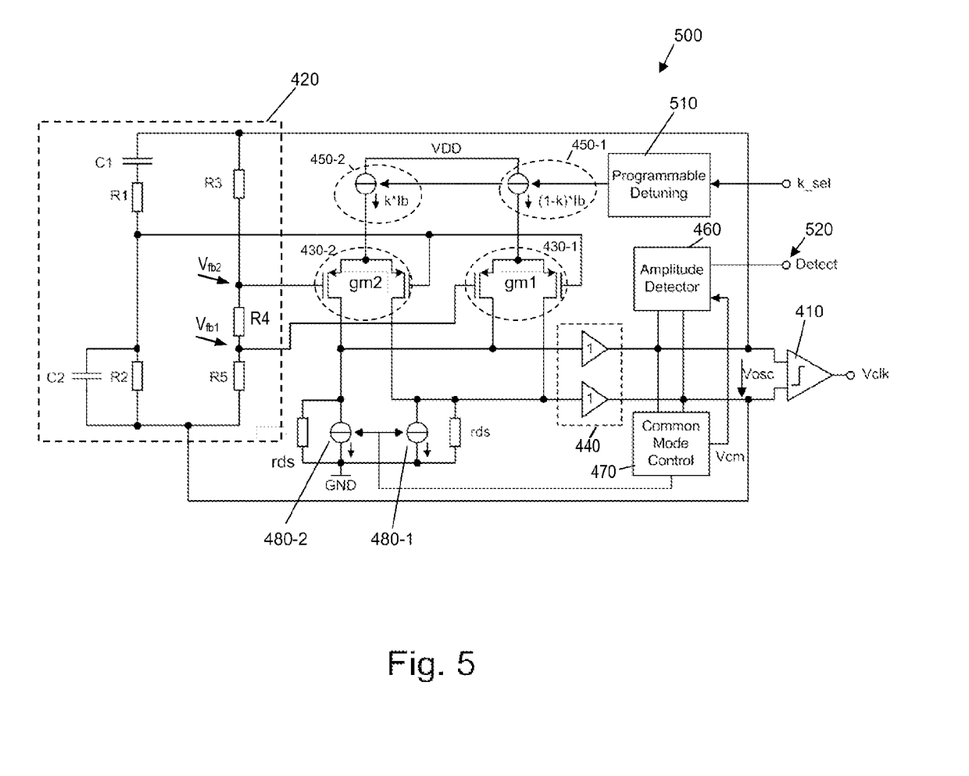
FIG. 5 depicts an alternative oscillator circuit comprising a Wien-bridge.

In an alternative embodiment, i.e., alternative to operating the Wien-bridge oscillator with a variable detune and amplitude control, the Wien-bridge can be operated with a constant detune, once the oscillator has started oscillating. In particular this approach can be of advantage for reference clock signal generators, since an additional temperature drift might be caused by variations of components in the amplitude control circuitry that can extend the temperature drift of the passive components in the Wien-bridge itself. In one embodiment a Wien-bridge oscillator has been realized exhibiting a constant detune of ε=1/15. Measured results show that these match the simulation pretty exact. The temperature drift of the oscillation frequency does not extend the specified temperature drift of the resistors in the Wien-bridge. Since the amplitude of the oscillation, i.e., the voltage amplitude, is not controlled, this voltage amplitude varies heavily in this alternative depending on process parameters and temperature. However, this is not a major drawback when the oscillator is used for generating a reference clock signal. In addition the deployed amplifier circuit effectuates a decrease of the amplification when the oscillation amplitude increases and thus causes a limitation of the amplitude. A potentially critical point when operating the circuit is the condition for starting the oscillation, i.e., when powering up the circuit. In case the detune is too small there will be no oscillation. To achieve an optimal adjustment of the detune, the detune can be implemented digitally programmable and the amplitude detector can be used for determining the adjustment, which causes the oscillator to start oscillating safely. As depicted in FIG. 5, the digital programmable detune can be implemented using the above described method of weighted addition of feedback signals, wherein there are also no MOS switches required in the Wien-bridge, that may have impact on frequency stability.

Note that in FIG. 5 components identically comprised in the arrangement depicted in FIG. 4 are referenced by identical reference numbers; the respective description of components of above applies correspondingly.

The circuitry 500 depicted in FIG. 5 differs from that of FIG. 4 in that amplitude detector 460 does not directly control weighting factor k, but provides a detect signal 520 indicating the amplitude of the oscillating voltage Vosc. Based the detect signal 520 a digital select signal k_sel is provided to programmable detuning block 510. Depending on the provided select signal k_sel block 510 either provides a weighting factor of k=0 or k being nearly zero in order to increase or to trigger the oscillation. In particular when powering up the circuit, i.e., when there is no initial oscillation and amplitude detector 460 provides a corresponding signal indicating no or an insufficient oscillation amplitude, programmable detuning may provide a weighting factor of k being zero to trigger the oscillation. Once the oscillation has started and amplitude detector 460 detects that a predefined amplitude threshold has been exceeded by the oscillation, thus outputting a corresponding detect signal 520, a select signal k_sel may be provided to programmable detuning block 510 for controlling the block 510 to provide a constant weighting factor k big enough to at least maintain the oscillation. In this way a weighting factor k reflecting a constant detune may be provided in order to maintain the oscillation.

In view of the above mentioned requirements to the amplifier, i.e., small phase shift, high amplification and small current consumption preferably below 30 μA, a comparatively low basic, i.e., resonant frequency, of the Wien-bridge oscillator of 125 kHz is chosen in one embodiment. Higher frequencies, for example system clock frequencies, e.g., at around 40 MHz as used in many integrated circuits, can be generated by deploying frequency synthesizer PLLs.

Figure 6:
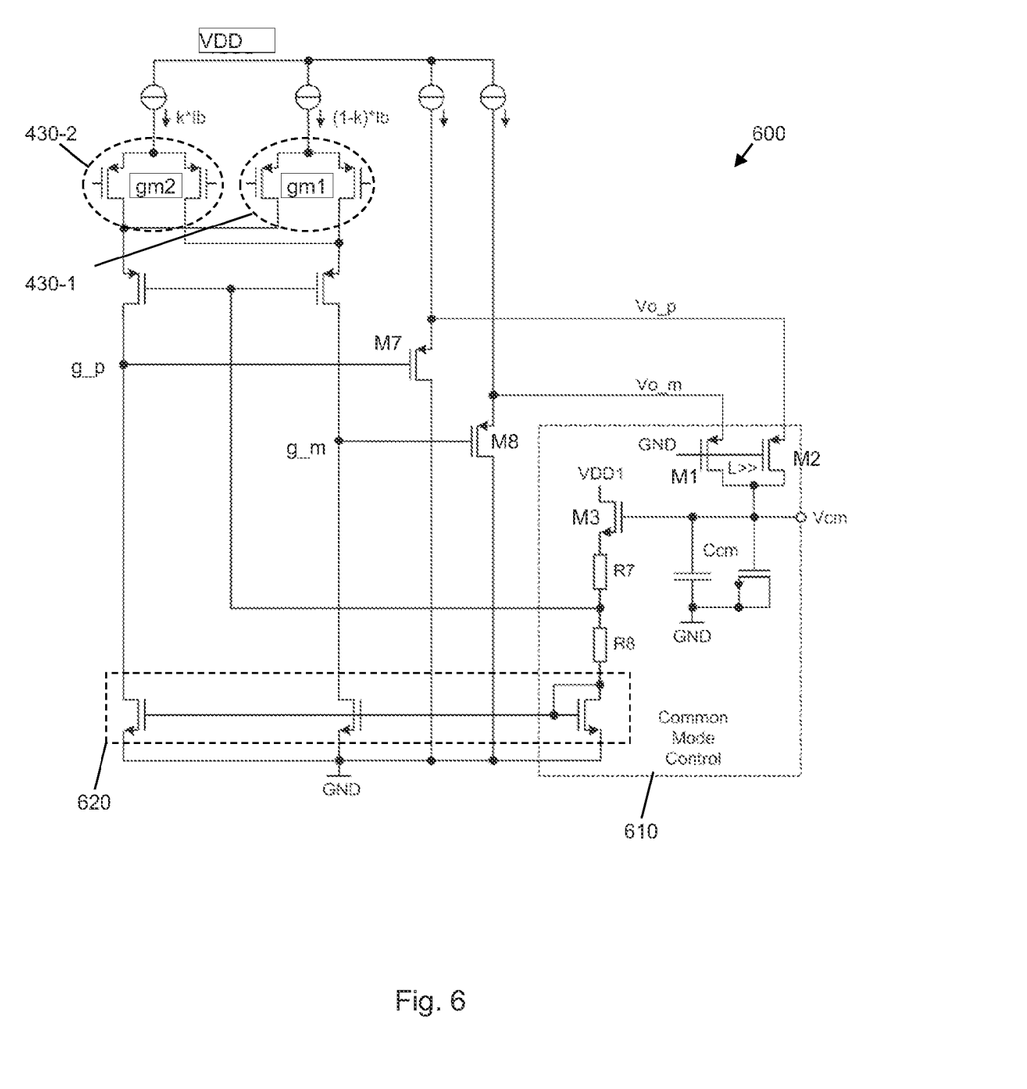
FIG. 6 depicts a common mode control for differential amplifiers.

For the sake of completeness the circuitry 600 of FIG. 6 depicts an embodiment of a common mode control 610 in order to provide suitable operation conditions for the differential amplifiers 430-1 and 430-2 and to maintain the voltages Vo_p and Vo_m in the desired range.

Current mirror 620, which forms part of the common mode control, provides a current that is proportional to the output common mode voltage Vcm, which is Vcm=Vo_p+Vo_m. When balanced this current must correspond to current Ib. In case Vcm increases the current in the current mirror increases and the voltage at nodes g_p and g_m correspondingly decrease. Source followers M7/M8 transfer the voltage decrease level-shifted to outputs Vo_p and Vo_m and thus counteract an increase of the common mode output voltage. The value of Vcm can be adjusted by dimensioning transistors M3-M6 and resistors R7-R8.

In the depicted embodiment the common mode output voltage Vcm is adjusted by a voltage divider comprising transistors M1 and M2, which due to their long channel act approximately like highly-resistive ohmic resistors.

Figure 7:
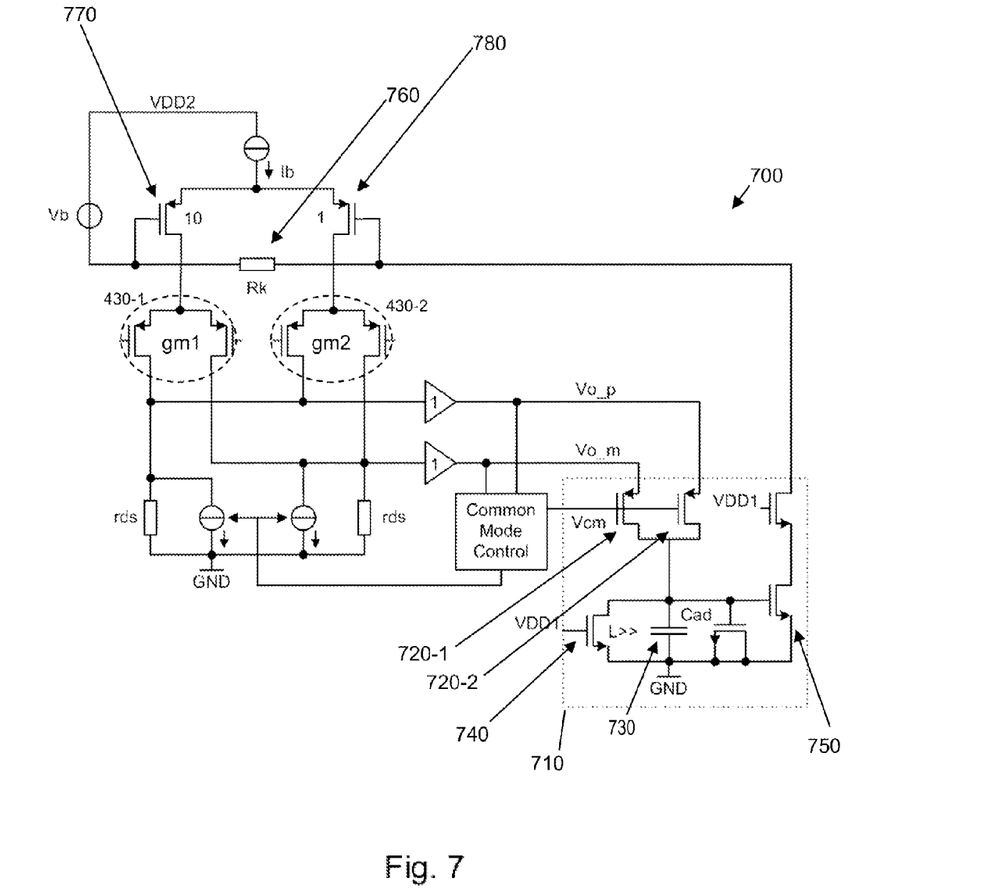
FIG. 7 depicts circuitry comprising an amplitude detector.

FIG. 7 depicts circuitry 700 comprising an embodiment of an amplitude detector 710. The amplitude detector circuit 710 compares voltages Vo_p and Vo_m with common mode voltage Vcm. In case the voltages exceed the threshold voltages of transistors 720-1 and 720-2, a charging current flows into capacitor Cad 730. The detune control comes into effect, if the averaged mean charge current exceeds that of the discharge current across transistor 740. Note that transistor 740 approximately acts as a highly resistive ohmic resistor. In this case the voltage of capacitor 730 exceeds that the threshold voltage of transistor 750 resulting in a current through resistor Rk 760. A voltage increase across resistor Rk effectuates an increase of the current portion of bias current Ib flowing through transistor M7 and through differential pair gm2. As long as the amplitude remains below the threshold, nearly all of current Ib flows through transistor 770 and differential pair 430-2, since transistor 770 is ten times bigger than transistor 780 causing a higher detune ∈1. Correspondingly, the higher the amplitudes of Vo_p and Vo_m, the bigger the portion of bias current flowing through differential pair 430-1 thus causing a decrease of the detune.

Whereas many alterations and modifications of the present invention will become apparent to a person of ordinary skill in the art after having read the foregoing description, it is to be understood that any particular embodiment shown and described by way of illustration is in no way intended to limit the scope of the claims which themselves recite only those features regarded as essential to the invention.

What is claimed is:

1. An oscillator circuit comprising:
    a Wien-bridge comprising a first branch having a plurality of series connected resistors and a second branch having resistors and capacitors, wherein a first feedback signal portion of zero detune based on a signal at a first node of the first branch and a second feedback signal portion exhibiting detune based on a signal at a second node of the first branch are coupled as feedback signals to the Wien-bridge;
    a first differential amplifier for weighted amplification of the first feedback signal portion;
    a second differential amplifier for weighted amplification of the second feedback signal portion; and
    an amplitude detection block configured to detect an amplitude of an oscillation of the oscillator circuit and to control a weighting factor.

2. The oscillator circuit of claim 1, wherein the first feedback signal portion and the second feedback signal portion are weighted before being coupled to the Wien-bridge.

3. The oscillator circuit of claim 1, wherein the first differential amplifier is supplied by a first current source and the second differential amplifier is supplied by a respective second current source, and wherein the first and second current sources are controlled by the weighting factor provided by the amplitude detection block.

4. An electrical circuit comprising:
    a Wien-bridge oscillator;
    a first differential amplifier controlled by a non-detuned signal tapped from the Wien-bridge oscillator, the first differential amplifier configured to output an amplified non-detuned signal;
    a second differential amplifier controlled by a detuned signal tapped from the Wien-bridge oscillator, the second differential amplifier configured to output an amplified detuned signal; and
    an amplitude detector coupled to a sum of the amplified non-detuned signal and the amplified detuned signal, wherein the amplitude detector is configured to provide a weighting factor for controlling amplification in the first and second differential amplifier based on the sum of signals.

5. The electrical circuit of claim 4, further comprising:
    a first current source configured to supply the first differential amplifier; and
    a second current source configured to supply the second differential amplifier;
    wherein the first current source and the second current source are controlled by the weighting factor.

6. The electrical circuit of claim 4, further comprising a common mode control circuit coupled to the sum of the amplified non-detuned signal and the amplified detuned signal, wherein the common mode control is configured to control the common mode operation of the first and second differential amplifier.

7. The electrical circuit of claim 4, further comprising a comparator block coupled to the sum of the amplified non-detuned signal and the amplified detuned signal.

8. The electrical circuit of claim 4, further comprising a buffer coupled to the sum of the amplified non-detuned signal and the amplified detuned signal.

9. A circuit for generating a clock signal comprising:
    a Wien-bridge oscillator; and
    means for tapping a non-detuned signal from the Wien-bridge oscillator;
    means for tapping a detuned signal from the Wien-bridge oscillator;
    means for weighting the detuned signal;
    means for weighting the non-detuned signal; and
    means for feeding back a sum of the weighted non-detuned signal and the detuned signal.

10. The circuit of claim 9, further comprising means for detecting an amplitude of the sum of the weighted non-detuned signal and the detuned signal.

11. The circuit of claim 10, further comprising a first current source and a second current source, the first current source supplying the means for weighting the detuned signal and said second current supplying the means for weighting the non-detuned signal.

12. The circuit of claim 9, wherein the means for weighting the non-detuned signal is a first differential amplifier and the means for weighting the detuned signal comprises a second differential amplifier, the circuit further comprising common mode control means for controlling a common mode output voltage of the first and second differential amplifier, the common mode control means being coupled to the sum of the weighted non-detuned signal and the detuned signal.

13. The circuit of claim 9, further comprising means for buffering the sum of the weighted non-detuned signal and the detuned signal.

14. A method for generating a clock signal, the method comprising:
    tapping a non-detuned oscillating signal from a Wien-bridge oscillator;
    tapping a detuned oscillating signal from the Wien-bridge oscillator;
    weighting the non-detuned oscillating signal;
    weighting the detuned oscillating signal; and
    feeding a sum of the weighted non-detuned signal and the weighted detuned signal back to the Wien-bridge oscillator.

15. The method of claim 14, further comprising, determining an amplitude of the sum of the weighted non-detuned signal and the weighted detuned signal, wherein the weighting of the non-detuned oscillating signal and the weighting for the detuned oscillating signal is based on the determined amplitude.

16. The method of claim 14, further comprising the step of buffering the sum of the weighted non-detuned signal and the weighted detuned signal.

17. The method of claim 14, further comprising determining common mode operation of the weighting the non-detuned oscillating signal and of the weighting the detuned oscillating signal.

18. The method of claim 14 further comprising providing the sum of the weighted non-detuned signal and the weighted detuned signal to a comparator to produce a clock signal.

19. A circuit for generating a clock signal comprising:
    a Wien-bridge oscillator; and
    a circuit for tapping a non-detuned signal from the Wien-bridge oscillator;

a circuit for tapping a detuned signal from the Wien-bridge oscillator;
a circuit for weighting the detuned signal;
a circuit for weighting the non-detuned signal; and
a circuit for feeding back a sum of the weighted non-detuned signal and the detuned signal.

* * * * *